(12) United States Patent
Coolidge et al.

(10) Patent No.: US 6,677,743 B1
(45) Date of Patent: Jan. 13, 2004

(54) HIGH VOLTAGE POWERLINE SENSOR WITH A PLURALITY OF VOLTAGE SENSING DEVICES

(75) Inventors: Aaron P. Coolidge, Norton, MA (US); Timothy Mason, Uxbridge, MA (US); Michael Kast, Palo Alto, CA (US); Stephen P. Gill, Atherton, CA (US)

(73) Assignee: Foster-Miller, Inc., Waltham, MA (US)

( * ) Notice: Subject to any disclaimer, the term of this patent is extended or adjusted under 35 U.S.C. 154(b) by 0 days.

(21) Appl. No.: 09/264,231

(22) Filed: Mar. 5, 1999

(51) Int. Cl.[7] .............................................. G01R 31/00
(52) U.S. Cl. ....................................... 324/126; 324/142
(58) Field of Search ................................ 324/126, 127, 324/117 R, 109, 122, 156, 157, 142; 340/870.02

(56) References Cited

U.S. PATENT DOCUMENTS

| | | |
|---|---|---|
| 2,241,837 A | 5/1941 | Williams et al. |
| 3,142,015 A | 7/1964 | Dusters et al. |
| 3,312,895 A | 4/1967 | Garbuny |
| 3,428,896 A | 2/1969 | Schweitzer, Jr. |
| 3,504,283 A | 3/1970 | Meservey |
| 3,991,403 A | 11/1976 | Olsson |
| 4,002,976 A | 1/1977 | Zulaski |
| 4,009,477 A * | 2/1977 | Rozylowicz ................ 324/126 |
| 4,140,257 A | 2/1979 | Peterson |
| 4,142,178 A | 2/1979 | Whyte et al. |
| 4,204,194 A | 5/1980 | Bogacki |
| 4,210,744 A | 7/1980 | Bateman |
| 4,210,901 A | 7/1980 | Whyte et al. |
| 4,268,818 A | 5/1981 | Davis et al. |
| 4,348,638 A | 9/1982 | Boldridge, Jr. |
| 4,350,980 A | 9/1982 | Ward |
| 4,383,243 A | 5/1983 | Krugel et al. |
| 4,384,289 A | 5/1983 | Stillwell et al. |
| 4,420,752 A | 12/1983 | Davis et al. |
| 4,535,447 A | 8/1985 | Rosanes et al. |
| 4,578,639 A | 3/1986 | Miller |
| 4,611,207 A * | 9/1986 | Anderson et al. ........... 324/126 |
| 4,622,535 A | 11/1986 | Ise et al. |
| 4,629,979 A | 12/1986 | Missout et al. |
| 4,668,934 A | 5/1987 | Shuey |
| 4,709,339 A | 11/1987 | Fernandes |
| 4,714,893 A | 12/1987 | Smith-Vaniz |
| 4,724,381 A | 2/1988 | Crimmins |
| 4,758,962 A | 7/1988 | Fernandes |
| 4,759,973 A | 7/1988 | Phillips |
| 4,777,381 A | 10/1988 | Fernandes |
| 4,786,862 A * | 11/1988 | Sieron ........................ 324/127 |
| 4,791,361 A * | 12/1988 | Beihoff et al. ............. 324/126 |
| 4,794,327 A | 12/1988 | Fernandes |
| 4,794,328 A | 12/1988 | Fernandes et al. |
| 4,794,329 A | 12/1988 | Schweitzer, Jr. |
| 4,799,005 A | 1/1989 | Fernandes |
| 4,801,937 A | 1/1989 | Fernandes |
| 4,808,916 A | 2/1989 | Smith-Vaniz |
| 4,808,917 A | 2/1989 | Fernandes et al. |
| 4,823,022 A | 4/1989 | Lindsey |
| 4,827,272 A | 5/1989 | Davis |
| 4,829,298 A | 5/1989 | Fernandes |
| 4,831,327 A | 5/1989 | Chenier et al. |
| 4,847,780 A | 7/1989 | Gilker et al. |
| 4,855,671 A | 8/1989 | Fernandes |
| 4,862,088 A | 8/1989 | Etienne et al. |

(List continued on next page.)

*Primary Examiner*—Vinh P. Nguyen
(74) *Attorney, Agent, or Firm*—Iandiorio & Teska (57) ABSTRACT

A powerline sensor including a housing physically and electrically connectable to a powerline; a number of voltage sensing devices spaced peripherally about the housing, each voltage sensing device having an outer plate, an inner plate, and a dielectric material between the inner and out plates, the inner plates electrically connectable to the powerline, the outer plates electrically isolated form the powerline; and circuitry for sensing the voltage potential between the inner and outer plates to determine the voltage on the powerline.

31 Claims, 5 Drawing Sheets

U.S. PATENT DOCUMENTS

| | | |
|---|---|---|
| 4,904,996 A | 2/1990 | Fernandes |
| 4,935,693 A | 6/1990 | Falkowski et al. |
| 4,961,049 A | 10/1990 | Ghislanzoni |
| 4,999,571 A | 3/1991 | Ishiko et al. |
| 5,006,846 A | 4/1991 | Granville et al. |
| 5,015,944 A | 5/1991 | Bubash |
| 5,017,859 A | 5/1991 | Engel et al. |
| 5,051,733 A | 9/1991 | Neuhouser |
| 5,065,124 A | 11/1991 | Chrzan |
| 5,124,642 A | 6/1992 | Marx |
| 5,140,257 A | 8/1992 | Davis |
| 5,210,519 A | 5/1993 | Moore |
| 5,220,495 A | 6/1993 | Zulaski |
| 5,303,112 A | 4/1994 | Zulaski et al. |
| 5,397,982 A * | 3/1995 | Van Lankvelt .............. 324/126 |
| 5,426,360 A | 6/1995 | Maraio et al. |
| 5,473,244 A * | 12/1995 | Libove et al. .............. 324/126 |
| 5,477,091 A | 12/1995 | Fiorina et al. |
| 5,550,476 A | 8/1996 | Lau et al. |
| 5,559,377 A | 9/1996 | Abraham |
| 5,565,783 A | 10/1996 | Lau et al. |
| 5,656,931 A | 8/1997 | Lau et al. |
| 5,684,450 A | 11/1997 | Brown |
| 5,729,145 A | 3/1998 | Blades |
| 5,729,888 A | 3/1998 | Abdelgawad et al. |
| 5,758,962 A | 6/1998 | Ismar |
| 5,856,776 A | 1/1999 | Armstrong et al. |
| 5,892,430 A | 4/1999 | Wiesman et al. |
| 6,177,884 B1 | 1/2001 | Hunt et al. |

* cited by examiner

HIGH VOLTAGE POWERLINE SENSOR WITH A PLURALITY OF VOLTAGE SENSING DEVICES

FIELD OF THE INVENTION

This invention relates to a high voltage powerline sensor device.

BACKGROUND OF THE INVENTION

Monitoring conditions in or about a.c. powerlines, in both overhead and underground and primary and secondary applications, is a useful practice for electric utility companies in order to anticipate outages which occur due to faulty equipment and overloads on a.c. powerlines and which result in loss of service for potentially large numbers of customers. The potential for an outage and for loss of the greatest number of customers is increased during peak periods when power usage is at a maximum and delivery of continuous power is most critical. Outages caused by faulty and overloaded lines, transformers and other equipment are expensive to repair, dangerous for utility company employees, and costly to the electric utility company in terms of income lost for lost service and in terms of damage to the ultility's reputation.

Thus, a.c. powerline sensors which sense electrical conditions, such as power, voltage and current are very useful to electric utility companies in monitoring a.c. powerlines and associated equipment, such as transformers and switches, in order to better anticipate the likelihood of an unexpected outage occurring. The sensors allow the utility to monitor the conditions on the powerlines, and thus the sensors facilitate maintenance on and replacement of powerlines which are likely to become de-energized as a result of an overload or fault, thereby lowering the number of unexpected outages.

In order to perform this monitoring most efficiently, a communications link is typically established between each sensor on the system being monitored and a remote base station. This allows the utility company to monitor all of its sensors in one remote location instead of having to individually check each sensor in situ. One method of establishing a communications link is achieved by transmitting signals to a local ground station by means of, for example, an FM radio link. The signals are then transmitted to a remote central monitoring location via, e.g. radio, land lines or satellite channels. See U.S. Pat. No. 4,786,862 to Sieron.

Directly tapping the high-voltage powerline involves extensive work with the powerline de-energized to assure worker safety. Also, directly-connected sensing devices must be insulated against the high-voltage being carried in the powerlines typically resulting in an expensive sensor requiring significant effort to install.

SUMMARY OF THE INVENTION

Accordingly, it is an object of this invention to provide a high voltage powerline sensor.

It is a further object of this invention to provide such a high voltage powerline sensor which is more accurate than prior art powerline sensors.

It is a further object of this invention to provide such a high voltage powerline sensor which is not susceptible to the effects of adverse weather elements.

It is a further object of this invention to provide such a powerline sensor which is not susceptible to unknown and/or variable voltages induced in the sensor.

It is a further object of this invention to provide such a powerline sensor which is easy to assemble, construct, and install.

It is a further object of this invention to provide such a powerline sensor which can be attached to the powerline without de-energizing the powerline and without the need to directly trap the powerline.

This invention results from the realization that a more effective powerline sensor useful for, among other applications, low current, high voltage powerlines can be effected 1) by a housing with an apex and sloping sides which divert adverse whether elements which could otherwise affect voltage measurements, 2) by making the housing conductive and connecting it to the powerline to produce a faraday cage impervious to outside interference and to insure that an unknown and/or variable voltage is not induced in the housing, and 3) by the use of the number of physically discrete but electrically interconnected voltage sensing devices spaced about the periphery of the housing.

This invention features a powerline sensor comprising a housing physically and electrically connectable to a powerline and a plurality of voltage sensing devices spaced peripherally about the housing. Each voltage sensing device typically includes an outer plate, an inner plate, and a dielectric material between the inner and outer plates. The inner plates are electrically connectable to the powerline, the outer plates are electrically isolated from the power line. There are also means for sensing the voltage potential between the inner and outer plates. Alternatively, the function of the inner plates may be performed by the housing itself and thus the inner plates eliminated.

The inner and outer plates of all voltage sensing devices are preferably connected in series.

The inner plates are typically electrically connected to the powerline via a connection between an inner plate and the housing. The housing has n sides (e.g., 4) and n voltage sensing devices, one sensing device per side.

The preferred powerline sensor housing has a apex and sloping sides for diverting adverse weather elements. The housing is typically metal with an insulative coating thereon. The voltage sensing devices are usually secured to outer insulative coating of the metal housing. Further included may be a protective material over the outer plate of each voltage sensing device.

The housing is preferably black and the inner and outer plates of each voltage sensing device are typically copper foil. Further included may be means for transmitting the voltage potential sensed to a location remote from the sensor. A pair of spaced jaws on the housing are operable between an open position and a position closed about the powerlines for physically and electrically connecting the housing to the powerline.

Therefore, in one embodiment, the powerline sensor of this invention includes a housing attachable to a powerline, a plurality of voltage sensing devices spaced peripherally about the housing, each voltage sensing device including an outer plate, an inner plate, and a dielectric material between the inner and outer plates, the inner plates electrically connectable to the powerline and electrically connected to each other, the outer plates electrically isolated from the power line and electrically connected to each other and means for sensing the voltage potential between the inner and outer plates.

More broadly stated, this invention features a powerline sensor comprising a housing having n sides, a plurality of n voltage sensing devices, one voltage sensing device per side, each voltage sensing device including an outer plate, an inner plate, and a dielectric material between the inner and outer plates; and means for sensing the voltage potential between the inner and outer plates.

Even more broadly, the powerline sensor of this invention comprises a housing electrically connected to a powerline, the housing having an apex for diverting adverse weather elements; and a plurality of voltage sensing devices spaced peripherally about the housing.

Each voltage sensing device typically includes an outer plate, an inner plate, and a dielectric material between the inner and outer plates, the inner plates are electrically connectable to the powerline, the outer plates electrically isolated form the powerline. The outer plates of all voltage sending devices are connected in series. The inner plates are electrically connected to the powerline via a connection between an inner plate and the housing. The housing may have n (e.g., 4) sides and n voltage sensing devices, one sensing device per side.

The housing is preferably made of metal and has an insulative coating thereon. The voltage sensing devices are usually secured to the outer insulative coating of the metal housing. The housing is usually black and the inner and outer plates of each voltage sensing device are usually copper foil.

In the broadest sense, the invention thus features a housing physically and electrically connectable to a powerline, at least one voltage sensing device on the housing, an insulating (e.g. dielectric) material between the voltage sensing device and the housing, and a circuit or some other means for determining the voltage on the powerline.

DISCLOSURE OF THE PREFERRED EMBODIMENT

Figure 1:
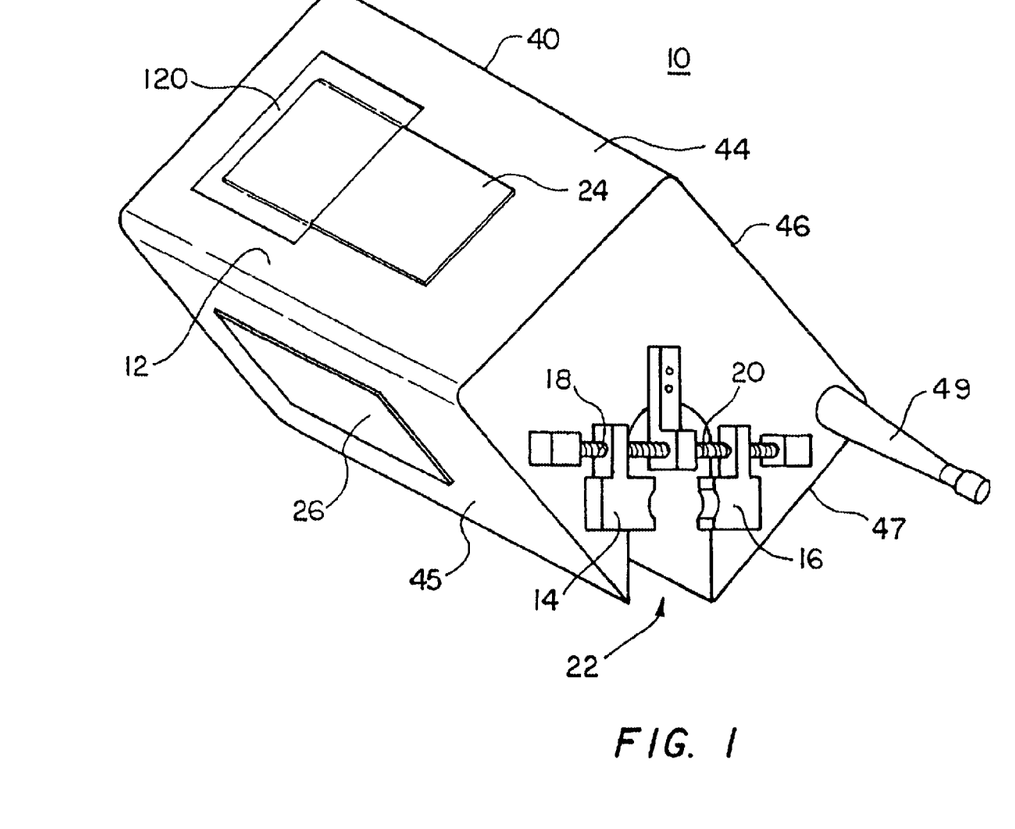
FIG. 1 is a schematic view of the powerline sensor of the subject invention.

Sensor 10, FIG. 1, includes housing 12 physically and electrically connectable to a powerline via spaced jaws 14 and 16 which are operable to close and clamp about the powerline via screw devices 18 and 20. A similar jaw arrangement is located on the other end of housing 12 such that housing 12 saddles the powerline which passes through corridor 22.

Figure 2:
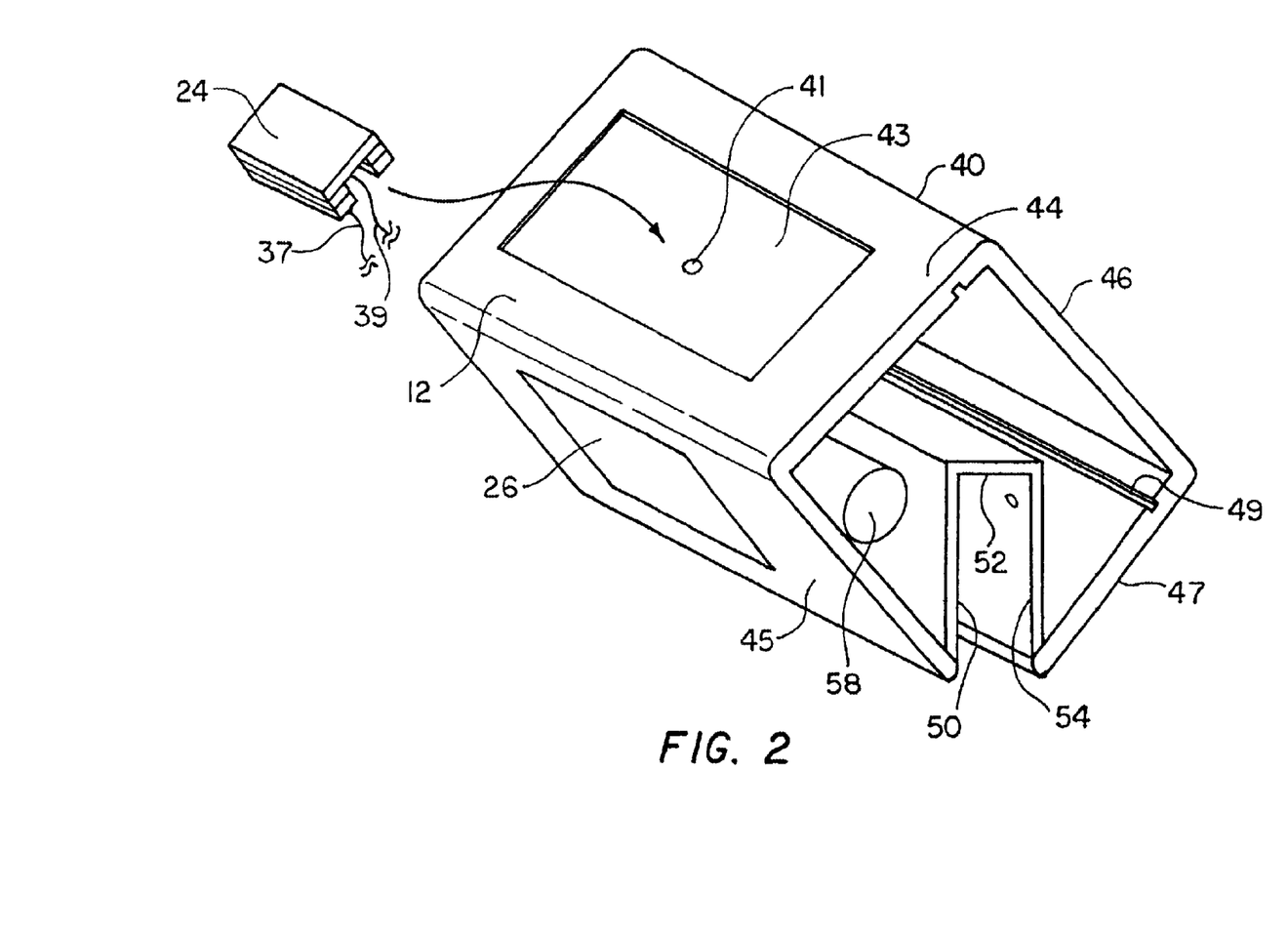
FIG. 2 is a schematic view of the sensor shown in FIG. 1 with the front cover removed to reveal the inside of the housing of the sensor of this invention.
Figure 4:
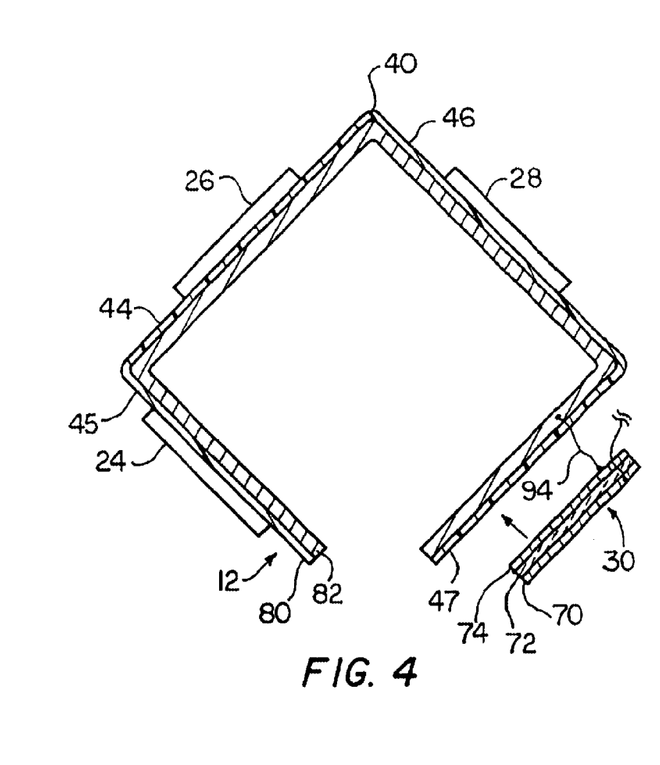
FIG. 4 is a schematic cross-sectional view of the housing shown in FIG. 1.

Spaced about or on the periphery of housing 12 are voltage sensing devices 24, 26, 28, and 30, FIGS. 1, 2, and 4. The housing as shown has n=four sides and four voltage sensing devices, one per side. However, other configurations are possible (e.g. six sides and six sensing devices). As shown in FIG. 2, surface 44 includes recess 43 for receiving sensor 24 and orifice 41 for receiving wires 37 and 39. The other surfaces 45, 46, and 47 are of a similar construction.

In the preferred embodiment, housing 12 has an apex 40, FIGS. 1, 2, and 4, and downwardly sloping surfaces 44 and 46 (and surfaces 45 and 47) to divert adverse weather elements such as snow and rain which could otherwise accumulate and affect or render erroneous, voltage measurements in accordance with this invention.

Figure 3:
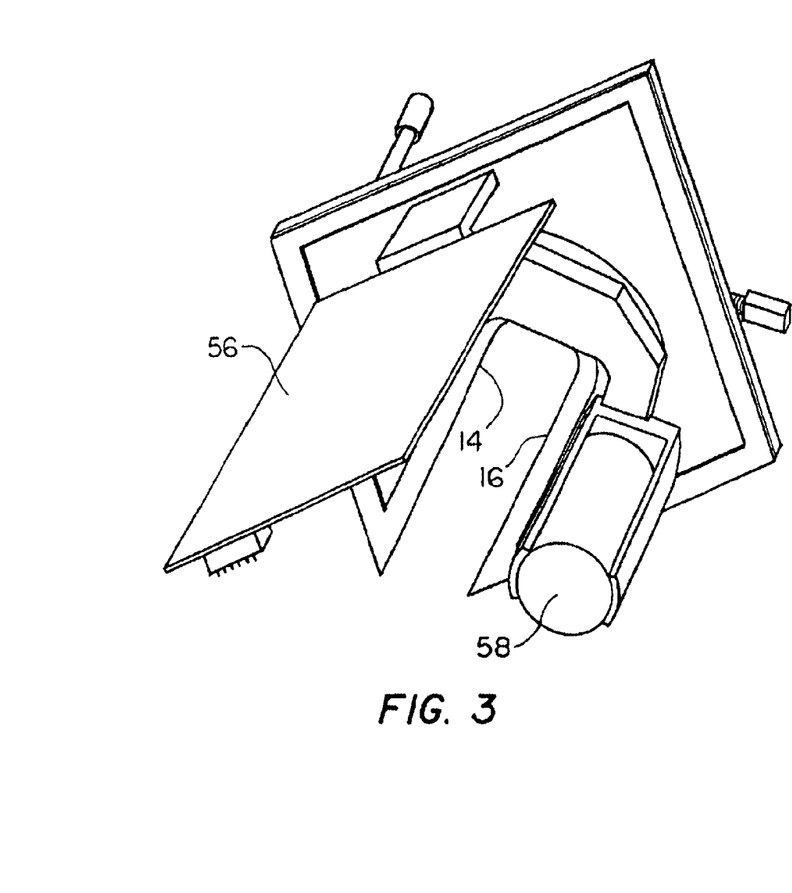
FIG. 3 is a schematic rear view of the front cover assembly of the housing shown in Fig. 1.

Inside housing 12, FIG. 2, are ABS plastic or aluminum plates 50, 52, and 54, circuit board 56, FIG. 3, and battery 58, for example. See U.S. application Ser. No. 08/604,357 incorporated herein by this reference for a discussion of possible sensor and signal transmission electronic subsystems which may be housed within protective housing 12. Slots 49 and 51, FIG. 2 receive circuit board 56, FIG. 3. Also inside housing 12 is Rogowski current sensor 202, FIG. 3.

As more clearly shown in FIG. 4, each voltage sensing device 24, 26, 28, and 30 includes, as shown for device 30, outer plate 70, inner plate 74, and dielectric material 72 therebetween.

Inner and outer plates 70 and 74 may be, for example, 4.950"×1.950"×0.002" thick copper or aluminum foil plates. Dielectric material 72 is typically 0.031" inches thick and preferably a Teflon-ceramic composition available from Rogers Corp., Microwave and Circuit Materials Division, Chandler, Ariz. 85226 under the trade name "RT-duroid 6002".

Each voltage sensing device 24, 26, 28, and 30 is of a similar construction and is attached to a respective side of housing 12. Housing 12, in turn, is made of metal, for example aluminum but includes outer hard anodized insulative coating 80 between voltage sensing devices 24, 26, 28, and 30 and metal core 82. Coating 80 is not actually as thick as shown in FIG. 3. The inner plates could be secured right on the bare metal surface of the housing provided the anodized coating is masked in these areas. Coating 80 and Teflon tape 120 function to prevent the outer plates of each sensor from electrically contacting the powerline or the bare metal housing due to dirt, salt, or other debris buildup over time or during inclement weather. The coating provides electrical isolation between the Faraday cage of the housing and the voltage sensors.

Figure 5:
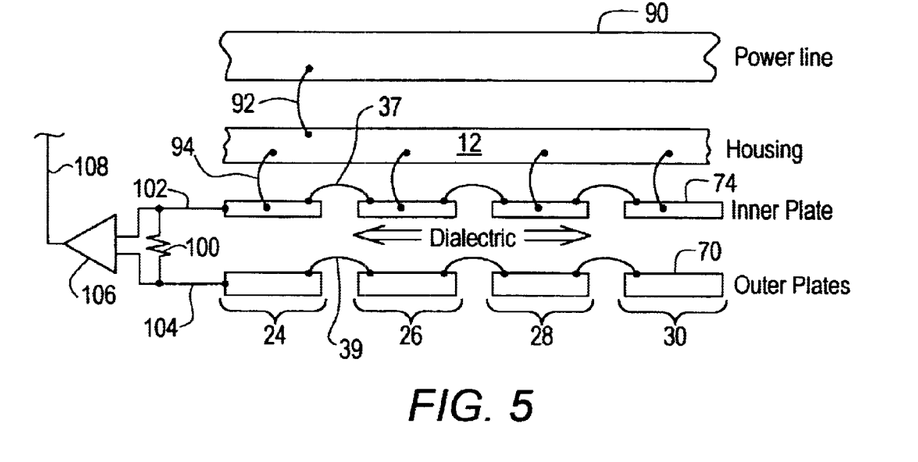
FIG. 5 is a schematic diagram showing the electrical interconnection between the primary components of the powerline sensor of this invention.

Clamps 14 and 16, FIG. 1, electrically connect power line 90, FIG. 5, to housing 12 shown schematically by wire 92. All the inner plate of each voltage sensor 24, 26, and 30 are then connected in series as shown in FIG. 5 and each inner plate is connected to powerline 90 via housing 12 as shown, for example, by wire 94.

Thus, all the inner plates are electrically connected to the powerline. The outer plates of each voltage sensor, however, are only connected to each other in series as shown and thus the potential across the inner and outer plates is indicative of the voltage on the powerline. There are means, such as resistor 100, FIG. 5, between line 102 connected to the inner plates and line 104 connected to the outer plates and amplifier 106 for sensing the voltage potential between the inner and outer plates and thus for determining the voltage on the powerline. Other means are possible and with the scope of this invention including voltage nulling circuits and the like which function to keep the housing and the voltage sensors at the same voltage.

In a typical application, powerline 90 is an overhead line and carries between 4,000 and 36,000 volts peak. Resistor 100 is 600 KΩ and the signal at output 108 is between 3–5 volts and directly proportional to the voltage on powerline 90 due to the capacitive coupling of each voltage sensor to powerline 90 and to the earth.

There are preferably a plurality, e.g. more than one, and even typically more than two such voltage sensing devices because then at least one plate will be facing the earth or some other structure connected to the earth. A miniscule amount of charge flows off the powerline through the housing via the clamps through the inner plates, through the dielectric material, across the outer plates, through the air, and to the earth. Four plates (or more) help ensure that at least one plate will have a path to the earth. Three plates or less on the outside of the housing is however within the scope of this invention. The plates are all connected in series to reduce the cost of circuitry required to condition the signal and to ensures an even distribution of charge over sensor plates. The plates are all connected in series to reduce the cost of circuitry required to condition the signal and to ensure an even distribution of charge over sensor plates. In an alternative construction, the discrete inner plates could be eliminated and their function performed by the housing itself such that portions of the housing are the "inner plates".

Housing 12 is preferably painted black to assist in melting any snow or ice which contacts it. Housing 12 is electrically connected to powerline 90 for two reasons. First, such a connection renders housing 12 a faraday cage which is impervious to outside electrical interference which could affect the measurement of the line voltage across resistor 100. Second, this electrical connection ensures that housing 12 is at a known voltage (i.e. the powerline voltage) and not some unknown or variable induced voltage—again, a situation which would affect voltage measurements across resistor 100.

In order to reduce the adverse affects of moisture on the outer plates of each sensor, housing 12 preferably has apex 40, FIGS. 1, 2, and 4 and sloping sides 44, 45, 46, and 47. Further, there may be a protective "Teflon" tape coating 120, FIG. 1 over each voltage sensor. Also or alternatively, the outer surface of the housing can be impregnated with a Teflon or Teflon-like material. A dark or black colored material for the outer coating 80, FIG. 4, of housing 12 also assists in melting away any ice or snow which temporarily deposits on housing 12.

Figure 6:
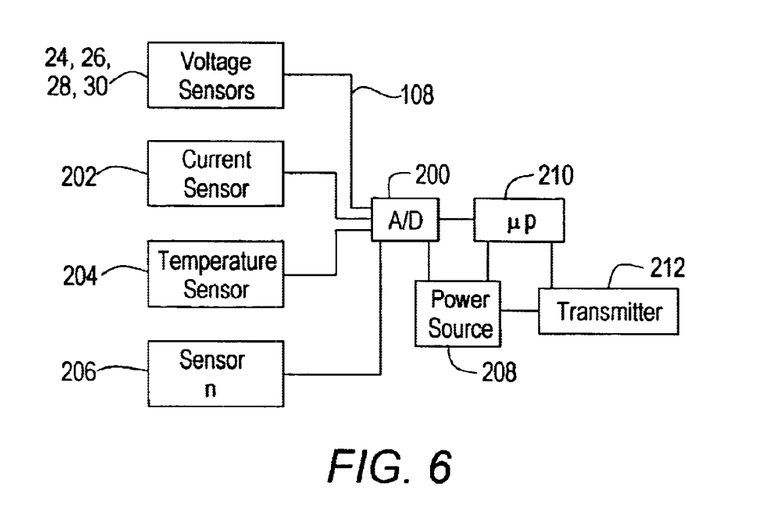
FIG. 6 is a block diagram of the sensing, processing, and transmitting subsystems of a sensor in accordance with the subject invention.

As shown in FIG. 6, output 108, FIG. 4 and the outputs of any other sensors resident within the electronic circuitry on circuit board 56, FIG. 3 in housing 12 are connected to A-D converter 200, FIG. 6. A current sensor 202 such as a "Rogowski" coil may be included as well as temperature sensor 204 (e.g., a thermocouple) and any other kind of desired sensor, generally shown as sensor n 206, in FIG. 6 (for example a vibration sensor) may be disposed within housing 12.

Microprocessor 210 powered by power source 208, for example, battery 58, FIGS. 2 and 3, samples and processes all the data from all the sensors to be periodically transmitted by transmitter 212, for example a radio connected to antenna 49, FIG. 1. Power source 208 could be a photovoltaic cell or some other device and transmitter 212 could be powerline carrier electronic devices known in the art. Microprocessor 210 is typically programmed to perform a harmonic analysis and to construct the power factor of the voltage signal on line 108. Microprocessor 210 is also typically programmed to output line voltage and other data to be transmitted by transmitter 212 periodically rather than continuously to save power.

Figure 7:
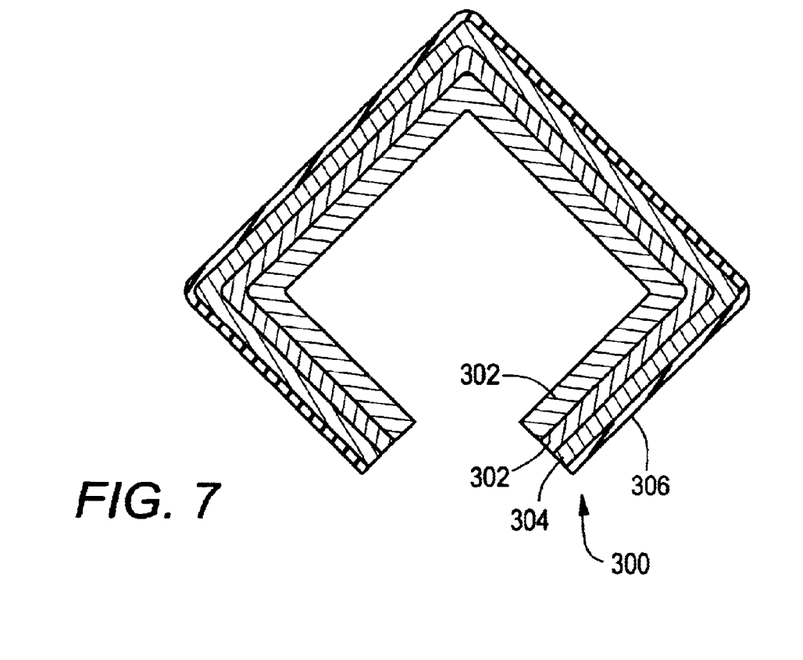
FIG. 7 is a schematic cross-sectional view of another sensor design in accordance with this invention.

In another embodiment, there is one voltage sensing device 300, FIG. 7 on housing 302, voltage sensing device 300 including inner plate 302, dielectric layer 304, and outer plate 306. In this situation inner plate 302 makes physical and electrical contact with metal conductive housing 302 via, for example, a conductive epoxy. The outside of outer plate 306, however, is preferably protected with a Teflon material. In this case, the voltage potential across inner plate 302 and outer plate 306 is read by the electrical circuit within housing 302. In another embodiment, there may be no inner plate and then the voltage potential between the housing 302 and outer plate 306 would be determined.

Figure 8:
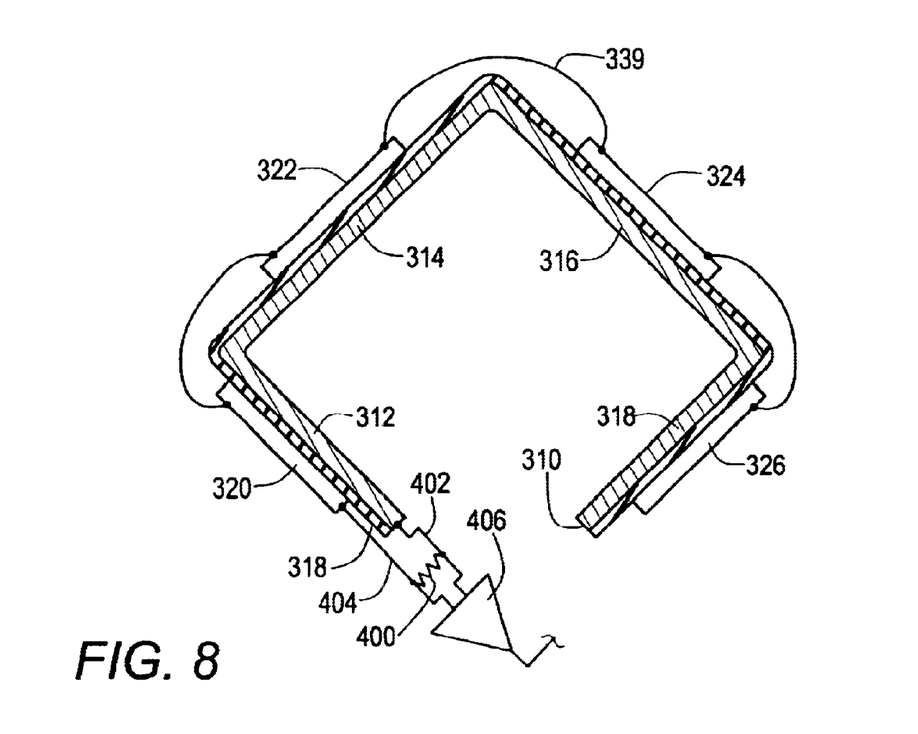
FIG. 8 is a schematic cross-sectional view of still another sensor design in accordance with this invention.

In still another embodiment, the voltage sensors and the housing are even more integrated. Housing 310, FIG. 8 includes voltage sensor areas 312, 314, 316, and 318. The remainder of the housing functions as a Faraday cage. Insulation layer 318 insulates outer plates 320, 322, 324, and 326 with respect to housing 310 and also protects the housing faraday cage areas between the plates against current voltage leakage from the housing to the outer plates. Also, Teflon tape may be disposed over plates 320, 322, 324, and 326. In this embodiment, the outer plates are connected in series as shown by wires 339 and wired to the circuit board which includes some means of detecting the voltage potential between the housing and ground, such as resistor 400 between line 402 connected to the housing and line 404 connected to the outer plates and amplifier 406.

Accordingly, the powerline sensors in accordance with this invention are more effective than prior art sensors at reading the voltage on the powerline especially when the powerline is a low current, high voltage overhead powerline. The housing with the apex and the sloping sides directs adverse weather elements away from the voltage sensing devices to insure that voltage measurement is not affected by moisture. The housing itself is at least partially conductive and connected to the powerline to produce a Faraday cage impervious to outside interference and to ensure that an unknown and/or variable voltage is not induced in the housing. The voltage sensors themselves are novel in that there are typically a plurality of peripherally disposed, physically discrete, but electrically connected voltage sensing devices spaced about the perimeter of the housing. In the broadest sense, however, a voltage sensing device disposed on the outside of the housing and which provides a path to earth ground including an outer plate or housing "area" insulated from the rest of the housing.

Although specific features of the invention are shown in some drawings and not in others, this is for convenience only as each feature may be combined with any or all of the other features in accordance with the invention.

Other embodiments will occur to those skilled in the are and are within the following claims:

What is claimed is:

1. A powerline sensor comprising:
   a housing physically and electrically connectable to a powerline;
   a plurality of voltage sensing devices spaced peripherally about the housing, each voltage sensing device including:
      an inner plate attached to the exterior of said housing,
      a dielectric material in contact with said inner plate, and
      an outer plate in contact with said dielectric material such that said dielectric material is between said inner and outer plates,
      the inner plates electrically connectable to the powerline and electrically connectable to the powerline and electrically connected to each other, the outer plates electrically isolated from the powerline and electrically connected to each other; and means for sensing the voltage potential between the inner and outer plates to determine the voltage on the powerline.

2. The powerline sensor of claim 1 in which the inner plates of all voltage sensing devices are connected in series.

3. The powerline sensor of claim 1 in which the outer plates of all voltage sensing devices are connected in series.

4. The powerline sensor of claim 1 in which the inner plates are electrically connected to the powerline via a connection between an inner plate and the housing.

5. The powerline sensor of claim 1 in which the housing has n sides and n voltage sensing devices, one sensing device per side.

6. The powerline sensor of claim 5 in which n=4.

7. The powerline sensor of claim 1 in which the housing has a apex and sloping sides for diverting adverse weather elements.

8. The powerline sensor of claim 1 in which the housing is metal.

9. The powerline sensor of claim 8 in which the metal housing has an insulative coating thereon.

10. The powerline sensor of claim 9 in which the voltage sensing devices are secured to the insulative coating of the metal housing.

11. The powerline sensor of claim 1 further including a protective material over the outer plate of each voltage sensing device.

12. The powerline sensor of claim 1 in which the housing is dark colored.

13. The powerline sensor of claim 1 in which the inner and outer plates of each voltage sensing device are copper foil.

14. The powerline sensor of claim 1 further including means for transmitting the voltage potential sensed to a location remote from the sensor.

15. The powerline sensor of claim 1 further including a pair of spaced jaws on the housing operable between an open position and a position closed about the powerline for physically and electrically connecting the housing to the powerline.

16. A powerline sensor comprising:

a housing attachable to a powerline;

a plurality of voltage sensing devices spaced peripherally about the housing, each voltage sensing device including:

an inner plate attached to the exterior of said housing, an outer plate, and a dielectric material disposed between the inner and outer plates, the inner plates electrically connectable to the powerline and electrically connected to each other, the outer plates electrically isolated from the power line and electrically connected to each other; and means for sensing the voltage potential between the inner and outer plates to determine the voltage on the powerline.

17. A powerline sensor comprising:

a housing having n sides, said housing physically and electrically connectable to a powerline;

a plurality of n voltage sensing devices, one voltage sensing device per side, each voltage sensing device including:

an inner plate attached to said side of said housing, an outer plate, and a dielectric material disposed between the inner and outer plates; and means for sensing the voltage potential between the inner and outer plates.

18. A powerline sensor comprising:

a plurality of voltage sensing devices spaced peripherally about a powerline, each voltage sensing device including:

an inner plate, an outer plate, and a dielectric material disposed between the inner and outer plates, the inner plates electrically connected to the powerline, the outer plates electrically isolated from the powerline; and means for sensing the voltage potential between the inner and outer plates.

19. The powerline sensor of claim 18 in which the inner plates of all voltage sensing devices are connected in series.

20. The powerline sensor of claim 18 in which the outer plates of all voltage sensing devices are connected in series.

21. The powerline sensor of claim 18 in which the inner and outer plates of each voltage sensing device are copper foil.

22. A powerline sensor comprising:

a housing electrically connected to a powerline, the housing having an apex for diverting adverse weather elements; and a plurality of voltage sensing devices spaced peripherally about the housing, each voltage sensing device including an outer plate, an inner plate, and a dielectric material between the inner and outer plates, the inner plates electrically connectable to the powerline, the outer plates electrically isolated from the powerline.

23. The powerline sensor of claim 22 in which the outer plates of all voltage sensing devices are connected in series.

24. The powerline sensor of claim 22 in which the inner plates are electrically connected to the powerline via a connection between an inner plate and the housing.

25. The powerline sensor of claim 22 in which the housing has n sides and n voltage sensing devices, one sensing device per side.

26. The powerline sensor of claim 25 in which n=4.

27. The powerline sensor of claim 22 in which the housing is metal.

28. The powerline sensor of claim 27 in which the metal housing has an insulative coating thereon.

29. The powerline sensor of claim 28 in which the voltage sensing devices are secured to the insulative coating of the metal housing.

30. The powerline sensor of claim 22 in which the housing is black.

31. The powerline sensor of claim 22 in which the inner and outer plates of each voltage sensing device are copper foil.

* * * * *